(12) United States Patent
Li

(10) Patent No.: US 11,800,000 B2
(45) Date of Patent: Oct. 24, 2023

(54) ELECTRONIC TERMINAL AND MOBILE PHONE

(71) Applicant: GUANGDONG OPPO MOBILE TELECOMMUNICATIONS CORP., LTD., Dongguan (CN)

(72) Inventor: Jie Li, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 177 days.

(21) Appl. No.: 17/355,557

(22) Filed: Jun. 23, 2021

(65) Prior Publication Data

US 2021/0320993 A1 Oct. 14, 2021

Related U.S. Application Data

(63) Continuation of application No. PCT/CN2019/124185, filed on Dec. 10, 2019.

(30) Foreign Application Priority Data

Dec. 29, 2018 (CN) .......................... 201822277994.8

(51) Int. Cl.
*G06F 3/02* (2006.01)
*H04M 1/23* (2006.01)
(Continued)

(52) U.S. Cl.
CPC .......... *H04M 1/23* (2013.01); *G06F 3/04886* (2013.01); *H04B 1/3833* (2013.01);
(Continued)

(58) Field of Classification Search
CPC .... H04M 1/23; H04M 1/0277; H04M 1/0241; H04M 1/04; H04M 1/0256;
(Continued)

(56) References Cited

U.S. PATENT DOCUMENTS 9,852,854 B1 * 12/2017 Wang .................... H01H 13/06
2002/0142799 A1 10/2002 Chu-Chia et al.
(Continued)

FOREIGN PATENT DOCUMENTS

CN 101132579 A 2/2008
CN 201274512 Y 7/2009
(Continued)

OTHER PUBLICATIONS

International Search Report and Written Opinion dated Mar. 4, 2020 in International Application No. PCT/CN2019/124185. English translation attached.
(Continued)

*Primary Examiner* — Thuy N Pardo
(74) *Attorney, Agent, or Firm* — Sheppard, Mullin, Richter & Hampton LLP

(57) ABSTRACT

An electronic terminal includes a main body having a groove, and a main unit keyboard. A through hole is defined in a bottom of the groove. A main board is provided in the main body. A first connector is provided on a side of the main board facing away from the groove. The main unit keyboard includes a key part and a flexible circuit board connected to each other. An end of the flexible circuit board that faces away from the key part is provided with a second connector configured to match the first connector. The key part is received in the groove. The flexible circuit board passes through the through hole and extends into an inside of the main body. The second connector is fastened to the first connector. A mobile phone is also provided.

14 Claims, 11 Drawing Sheets

(51) Int. Cl.
    *G06F 3/04886* (2022.01)
    *H04B 1/3827* (2015.01)
    *H04M 1/02* (2006.01)
    *H04N 23/57* (2023.01)
    *H05K 1/11* (2006.01)

(52) U.S. Cl.
    CPC .......... *H04M 1/0277* (2013.01); *H04N 23/57* (2023.01); *H05K 1/118* (2013.01)

(58) Field of Classification Search
    CPC .. G06F 3/04886; G06F 1/1632; G06F 1/1647; G06F 1/1654; G06F 1/1675; G06F 1/1679; G06F 1/1681; G06F 1/1684; G06F 1/1692; H04B 1/3833; H04N 23/57; H04N 23/45; H05K 1/118
    USPC ........... 345/168, 156, 173, 174; 361/679.09; 715/788
    See application file for complete search history.

(56) References Cited

U.S. PATENT DOCUMENTS

| | | | |
|---|---|---|---|
| 2011/0115744 A1 | 5/2011 | Murayama et al. | |
| 2012/0268879 A1 | 10/2012 | Kim et al. | |
| 2013/0286623 A1 | 10/2013 | Slipy et al. | |
| 2014/0174901 A1* | 6/2014 | Lin | H01H 13/7073 200/535 |
| 2015/0253816 A1* | 9/2015 | Brehmer | G06F 1/1684 361/679.4 |
| 2015/0338886 A1* | 11/2015 | Seo | G06F 3/0202 361/679.09 |
| 2016/0128217 A1 | 5/2016 | Yoo et al. | |
| 2016/0378270 A1* | 12/2016 | Lee | G06F 3/0481 715/788 |
| 2018/0059740 A1* | 3/2018 | Kato | G06F 1/1681 |
| 2020/0042273 A1* | 2/2020 | Dong | G06F 1/1673 |
| 2020/0110501 A1* | 4/2020 | Lee | G06F 1/1684 |
| 2020/0192719 A1* | 6/2020 | Wilson | G06F 9/5061 |

FOREIGN PATENT DOCUMENTS

| | | |
|---|---|---|
| CN | 201893822 U | 7/2011 |
| CN | 105282283 B | 11/2017 |
| CN | 207037545 U | 2/2018 |

OTHER PUBLICATIONS

Extended European Search Report dated Dec. 20, 2021 received in European Patent Application No. EP 19905093.1.

* cited by examiner

ELECTRONIC TERMINAL AND MOBILE PHONE

CROSS-REFERENCE TO RELATED APPLICATION

The present application is a continuation of International Application No. PCT/CN2019/124185, filed on Dec. 10, 2019, which claims priority to Chinese Patent Application No. 201822277994.8, filed on Dec. 29, 2018, the entire contents of which are incorporated herein by reference.

TECHNICAL FIELD

The present disclosure relates to the technical field of mobile terminals, and more particularly, to an electronic terminal and a mobile phone.

BACKGROUND

Currently, for a mobile terminal such as a smart phone or a tablet computer, its performance, lightness, and thinness are mutually constrained. Further, use scenarios of a mobile phone are very limited.

SUMMARY

In view of the above, it is necessary to provide an electronic terminal and a mobile phone.

An electronic terminal includes a main body and a keyboard: a main body having a groove, wherein a through hole is defined in a bottom of the groove, a main board is provided in the main body, and a first connector is provided on a side of the main board facing away from the groove; and a first keyboard including a key part and a flexible circuit board that are connected to each other, wherein an end of the flexible circuit board facing away from the key part is provided with a second connector configured to match the first connector, the key part is received in the groove, the flexible circuit board passes through the through hole and extends into an inside of the main body, and the second connector is fastened to the first connector.

A mobile phone includes a first unit and a second unit. The first unit includes a main body and a first keyboard. The main body has a groove. A through hole is defined in a bottom of the groove. A main board is provided in the main body. A first connector is provided on a side of the main board that faces away from the groove. The first keyboard is mounted in the groove and includes a key part and a flexible circuit board that are connected to each other. An end of the flexible circuit board facing away from the key part is provided with a second connector configured to match the first connector. The key part is received in the groove. The flexible circuit passes through the through hole and extends into an inside of the main body. The second connector is fastened to the first connector. The second unit is detachably mountable to the main body.

BRIEF DESCRIPTION OF DRAWINGS

In order to illustrate the technical solutions of the embodiments of the present disclosure or the related art more clearly, the figures required in the description of the embodiments of the present disclosure or the related art will be briefly introduced below. Obviously, the figures described below are merely some embodiments of the present disclosure. Those of ordinary skill in the art can also obtain figures of other embodiments from these figures without any inventive efforts.

DESCRIPTION OF EMBODIMENTS

Figure 1:
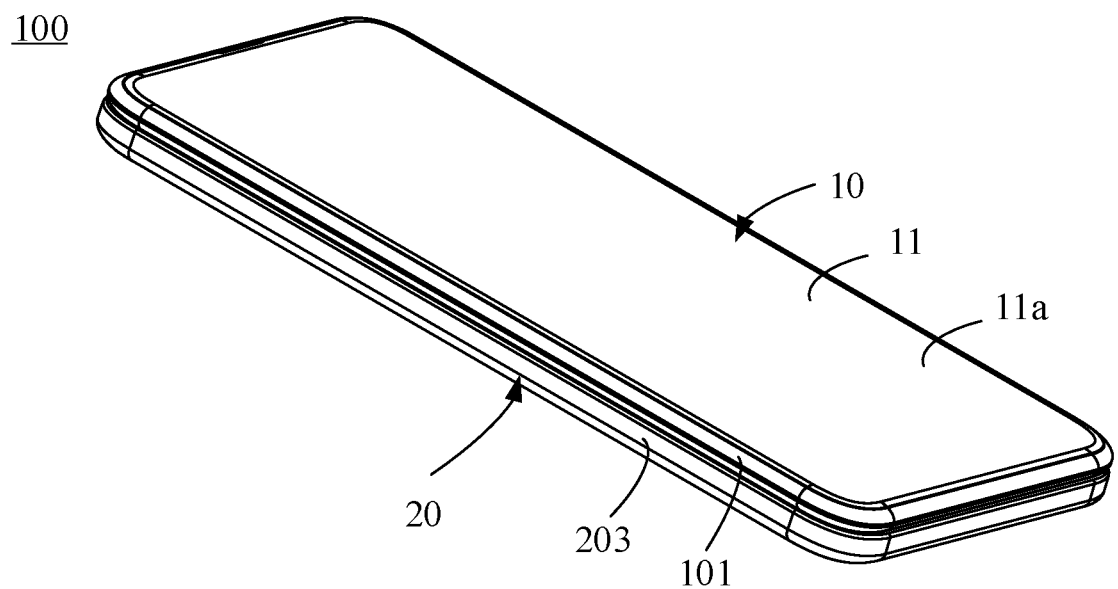
FIG. 1 is a schematic three-dimensional diagram of a mobile phone according to an embodiment.

In order to facilitate understanding of the present disclosure, the present disclosure will be described more fully hereinafter with reference to relevant figures. Preferred embodiments of the present disclosure are given in the accompanying figures. However, the present disclosure may be implemented in many different forms and is not limited to the embodiments described herein. Instead, an object of these embodiments is for a more comprehensive and thorough understanding of contents of the present disclosure.

As used herein, the term "terminal" includes, but not limited to, apparatuses that are capable of receiving and/or transmitting communication signals and connected via any one or more of the following connection ways:

(1) a wired line connection way, for example, via a Public Switched Telephone Networks (PSTN) connection, a Digital Subscriber Line (DSL) connection, a digital cable connection, or a direct cable connection;

(2) a wireless interface way, for example, via a cellular network, a Wireless Local Area Network (WLAN), a digital television network such as a DVB-H network, a satellite network, or an AM-FM broadcast transmitter.

A terminal device configured to communicate via a wireless interface may be referred to as a mobile terminal.

Examples of mobile terminals include, but not limited to, the following electronic apparatuses:

(1) a satellite phone or a cellular phone;

(2) a Personal Communications System (PCS) terminal that can combine cellular radio telephone with data processing, facsimile and data communication capabilities;

(3) a radiotelephone, a pager, an Internet/intranet access, a Web browser, a notepad, a calendar, and a Personal Digital Assistant (PDA) equipped with a Global Positioning System (GPS) receiver;

(4) a conventional laptop and/or handheld receiver;

(5) a conventional laptop and/or handheld radio telephone transceiver, etc.

In an aspect, a main unit capable of allowing a sub unit to be detachably mounted to the main unit. The sub unit is communicatively connected to the main unit after detached from the main unit. The main unit includes: a main body having a groove, wherein a through hole is defined in a bottom of the groove, a main board is provided in the main body, and a first connector is provided on a side of the main board facing away from the groove; and a main unit keyboard including a key part and a flexible circuit board that are connected to each other, wherein an end of the flexible circuit board facing away from the key part is provided with a second connector configured to match the first connector, the key part is received in the groove, the flexible circuit board passes through the through hole and extends into an inside of the main body, and the second connector is fastened to the first connector.

In an embodiment, the main body includes a front shell and a rear shell that are opposite to each other, and the groove is located in the front shell.

In an embodiment, an avoidance recess is defined in an end of the main board, and the flexible circuit board passes through the avoidance recess such that the second connector is wound to a side of the main board facing away from the groove.

In an embodiment, at least a part of the flexible circuit board is adhered to an inner surface of the front shell, and the main unit keyboard is adhered to the bottom of the groove by an adhesive.

In an embodiment, the main unit further includes a support. A receiving groove is defined in the front shell and matches the support, and the support is rotatable with respect to the main unit to be located at a first position or a second position. At the first position, the support is located within the receiving groove. At the second position, at least a part of the support is located outside the receiving groove, and the main unit keyboard is activated.

In an embodiment, the receiving groove is a U-shaped groove, and the groove is surrounded by the support at the first position.

In an embodiment, the main unit further includes a camera assembly. The camera assembly includes a first camera and a second camera. A thickness of the first camera is smaller than a thickness of the second camera. When the support is located at the first position, at least a part of the support and the first camera are stacked.

In an embodiment, the main unit further includes a Hall element. The Hall element is communicatively connected to the main board, and a magnet is provided on the support. When the support is located at the first position, the Hall element senses the magnet and the main board controls the main unit keyboard to be turned off. When the support is rotated from the first position to the second position, the Hall element fails to sense the magnet and the main board activates the main unit keyboard.

In an aspect, a mobile phone is provided. The mobile phone includes: a main unit including a main body and a main unit keyboard, wherein the main body has a groove, a through hole is defined in a bottom of the groove, a main board is provided in the main body, and a first connector is provided on a side of the main board that faces away from the groove; and the main unit keyboard includes a key part and a flexible circuit board that are connected to each other, an end of the flexible circuit board facing away from the key part is provided with a second connector configured to match the first connector, the key part is received in the groove, the flexible circuit passes through the through hole and extends into an inside of the main body, and the second connector is fastened to the first connector; and a sub unit detachably mountable to the main body.

In an embodiment, the main unit includes a front shell and a rear shell that are opposite to each other, and the groove is located in the front shell; the main unit further includes a support, a receiving groove is defined in the front shell and matches the support, and the support is rotatable with respect to the main unit to be located at a first position or a second position; at the first position, the support is located within the receiving groove; and at the second position, at least a part of the support is located outside the receiving groove such that the sub unit leans obliquely against the support, and the main unit keyboard is activated.

In an embodiment, a mounting groove is defined in the front shell, the groove penetrates through a bottom of the mounting groove, the receiving groove penetrates through a bottom of the receiving groove, and when the sub unit is mounted to the main body, a part of the sub unit is received in the mounting groove, and a gap is formed between the sub unit and the main unit keyboard.

In an embodiment, the main unit and the sub unit are both provided with contacts, and in a state that the sub unit is mounted to the main body, the contacts of the main unit and the contacts of the sub unit are in contact to transmit currents or data between the main unit and the sub unit.

In an embodiment, the main body further includes a magnetic member, and the sub unit includes a magnetic mating member, when the sub unit is mounted to the main body, the magnetic member attracts the magnetic mating member to connect the sub unit to the main body.

In an embodiment, the sub unit includes a sub unit keyboard, a sub unit main controller, a sub unit wireless transceiver module, and a display screen; and the main unit further includes a wireless modem module, a main unit main controller, and a main unit wireless transceiver module capable of communicating with the sub unit wireless transceiver module. In a first operation state of the mobile phone, under control of the sub unit main controller, a control command outputted by the sub unit keyboard is modulated by the sub unit wireless transceiver module and then transmitted to the main unit wireless transceiver module, and under control of the main unit main controller, the control command is modulated by the wireless modem module and transmitted to the air; and a control signal from the air is demodulated by the wireless modem module and then transmitted to the main unit main controller, and under control of the main unit main controller, the control signal is modulated by the main unit wireless transceiver module and then transmitted to the sub unit, and the control signal is received by the sub unit wireless transceiver module and then displayed on the display screen under control of the sub unit main controller.

In an embodiment, the sub unit includes a sub unit main controller, a microphone, an earphone, a sub unit wireless transceiver module, an audio encoder, and an audio decoder; and the main unit includes a wireless modem module, a main unit main controller, and a main unit wireless transceiver module capable of communicating with the sub unit wireless transceiver module. In a second operation state of the mobile phone, an audio signal from the microphone is encoded by the audio encoder and then transmitted to the sub unit main controller, the encoded audio signal is transmitted by the sub unit wireless transceiver module to the main unit wireless transceiver module under control of the sub unit main controller, then under control of the main unit main controller, the encoded audio signal is transmitted to the wireless modem module, modulated by the wireless modem module, and then transmitted to the air; and an encoded audio signal from the air is demodulated by the wireless modem module and then transmitted to the main unit main controller, and under control of the main unit main controller, the encoded audio signal is transmitted to the main unit wireless transceiver module, modulated by the main unit wireless transceiver module and then transmitted to the sub unit, then the encoded audio signal is demodulated by the sub unit wireless transceiver module, and under control of the sub unit main controller, the encoded audio signal is decoded by the audio decoder and outputted by the earphone.

In an embodiment, the sub unit includes a sub unit main controller and a sub unit wireless transceiver module, the sub unit main controller being capable of communicating with the sub unit wireless transceiver module. The main unit includes a wireless modem module, a main unit main controller, and a main unit wireless transceiver module capable of communicating with the sub unit wireless transceiver module, the main unit main controller being capable of communicating with the wireless modem module and the main unit wireless transceiver module, and the sub unit being capable of accessing a communication network through the main unit.

In an embodiment, the sub unit includes a sub unit main controller and a first wireless communication module, the sub unit main controller being capable of communicating with the first wireless communication module; and the main unit includes a main unit main controller, a second wireless communication module, and a third wireless communication module, the main unit main controller being capable of communicating with the second wireless communication module and the third wireless communication module, the second wireless communication module being capable of communicating with the first wireless communication module, and the third wireless communication module being capable of communicating with a base station.

In an aspect, a mobile phone is provided. The mobile phone includes: a main unit including a main body and a main unit keyboard, wherein the main body has a groove, a through hole is defined in a bottom of the groove, and a main board is provided in the main body; the main unit keyboard includes a key part and a flexible circuit board connected to the key part, the key part is received in the groove, and the flexible circuit board passes through the through hole and is connected to a side of the main board facing away from the groove; and a sub unit capable of being mounted to the groove and detached from the main body.

In an embodiment, the main unit further includes a support connected to the main body, a receiving groove is defined in the main body, and the support is rotatable with respect to the main unit to be located at a first position and a second position. At the first position, the support is located within the receiving groove; and at the second position, at least a part of the support is located outside the receiving groove, and the main unit keyboard is activated.

In an embodiment, the main body further includes a magnetic member, and the sub unit includes a magnetic mating member, and when the sub unit is mounted to the main body, the magnetic member is capable of attracting the magnetic mating member to connect the sub unit to the main body.

In an embodiment, the main unit and the sub unit are both provided with contacts, and in a state that the sub unit is mounted to the main body, the contacts of the main unit and the contacts of the sub unit are in contact to transmit currents or data between the main unit and the sub unit.

Figure 2:
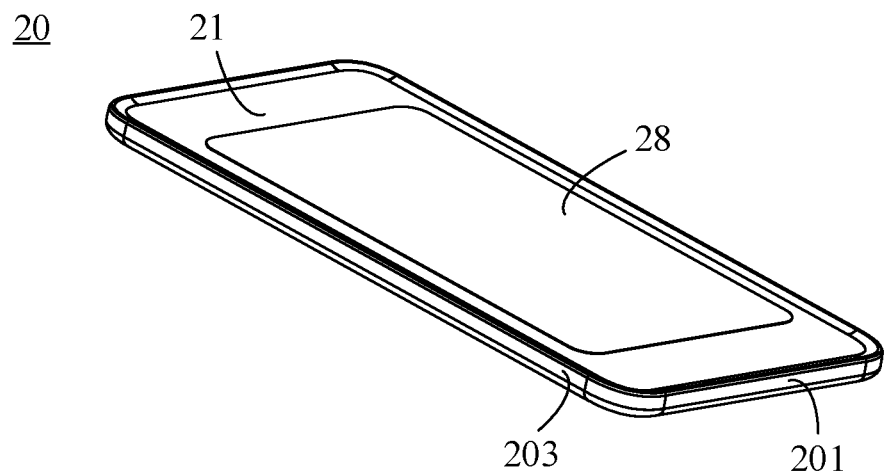
FIG. 2 is a schematic three-dimensional diagram of a main unit of the mobile phone as shown in FIG. 1.
Figure 3:
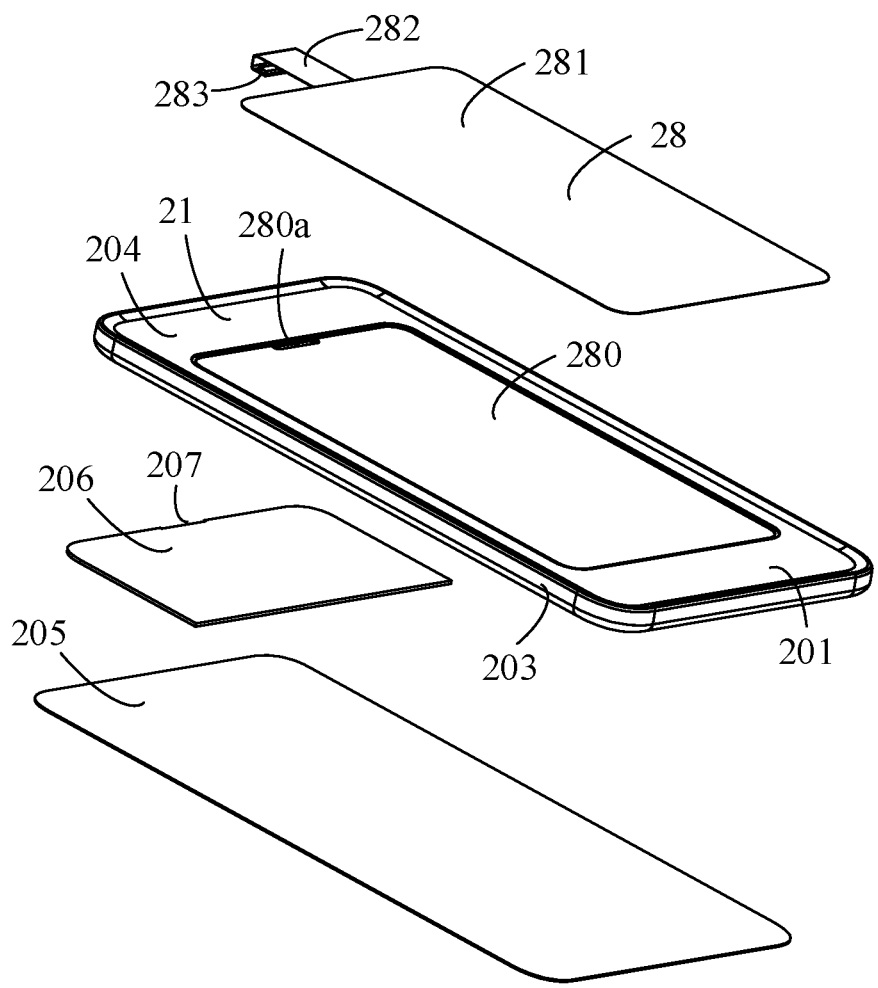
FIG. 3 is a schematic exploded diagram of the main unit as shown in FIG. 2.

Referring to FIGS. 1 to 3, in one embodiment, a mobile phone 100 includes a sub unit 10 and a main unit 20. The sub unit 10 has a front surface 11*a*, a rear surface, and a peripheral side surface 101. The rear surface is opposite to the front surface 11*a*, and the peripheral side surface 101 is connected between the front surface 11*a* and the rear surface. The sub unit 10 includes a display screen 11, which has a displayable area facing towards the front surface 11*a*. The main unit 20 includes a main body 21 and a main unit keyboard 28. The main body 21 includes a main unit wireless transceiver module, a first battery and a main board 206. The first battery can supply power to the main unit wireless transceiver module and the main board 206. The sub unit 10 can be mounted to the main body 21, and can be detached from the main body 21. The main body 21 can be in communicative connection with the sub unit 10 through the main unit wireless transceiver module.

The sub unit 10 and the main unit 20 of the mobile phone 100 described above are detachable from each other, and may be connected to each other in a wireless communication way after detached from each other, which facilitates the users and expands application scenarios. For example, when watching a video on the sub unit 10, a user can only hold the sub unit 10 in his/her hand(s), which is thinner and lighter. When the user operates the sub unit 10, the sub unit 10 can perform data transmission with the main unit 20 through a wireless communication connection, thereby achieving transmitting and receiving of commands between the sub unit 10 and the main unit 20 and completing the operation of the user on the sub unit 10. The main unit keyboard 28 is provided on the main unit 20, and has a mouse function at the same time, thereby facilitating the users. For example, the user may control the sub unit 10 through the main unit keyboard 28, which may imitate operations of a computer and expand the application scenarios of the mobile phone 100. The main unit keyboard 28 can achieve the function of virtual keys on the sub unit 10, avoiding setting any virtual keys on the sub unit 10. The main unit 20 may be connected to a computer display, such that a size of a displayed picture can be increased, and the computer display can be controlled by the main unit keyboard 28, facilitating application in certain scenarios. A projection apparatus may be mounted to the main unit 20, and a projection function can be controlled by the main unit keyboard 28, thereby expanding application scenarios of the main unit 20 and facilitating the user.

As shown in FIGS. 1 to 3, in one embodiment, the main body 21 includes a front shell 204 and a rear shell 205 that are opposite to each other. An outer surface of the front shell 204 forms a front end surface 201 of the main body 21, an outer surface of the rear shell 205 forms a rear end surface 202 (shown in FIG. 4) of the main body 21, and the front end surface 201 and the rear end surface 202 are opposite to each other. The front end surface 201 and the rear end surface 202 are connected by a side end face 203. When the sub unit 10 is mounted to the main body 21, the rear surface is fitted to the front end surface 201, and the peripheral side surface 101 is flush with the side end surface 203.

As shown in FIG. 2, in one embodiment, the main body 21 is in a shape of a rectangular block. The side end surface 203 includes a top end surface, a bottom end surface, a left end surface and a right end surface, the top end surface and the bottom end surface are connected between the left end surface and the right end surface, and the left end surface and the right end surface are connected between the top end surface and the bottom end surface. When the user is using the mobile phone 100 for a normal conversation, an earphone faces towards the ear and a microphone faces towards the mouth, a upward end of the main body 21 is defined as a top end, a downward end of the main body 21 is defined as a bottom end, a leftward end of the main body 21 is defined as a left end, and a rightward end is defined as a right end. A distance between the top end and the bottom end is a length of the main body 21, and a distance between the left end and the right end is a width of the main body 21.

In one embodiment, the sub unit 10 includes a sub unit wireless transceiver module and a second battery, and the second battery can supply power to the display screen 11 and the sub unit wireless transceiver module. It can be appreciated that, the sub unit 10 can be in communicative connection with the main unit wireless transceiver module via the sub unit wireless transceiver module, so as to achieve data and signal transmission between the sub unit 10 and the main body 21. The first battery may be a nuclear battery, for example, a tritium battery. The nuclear battery has a small volume, is relatively light and thin, has a long service life, and can provide electric energy for the main body 21, the main unit wireless transceiver module and other electronic components in the main body 21 for a long time. In other embodiments, the first battery may also be a lithium battery or the like, and may be repeatedly charged and discharged multiple times. In one embodiment, the second battery may be a lithium battery capable of being repeatedly charged and discharged multiple times, and may also be another type of battery, which is not limited herein.

As shown in FIGS. 2 to 5, in one embodiment, the main unit keyboard 28 includes a key part 281 and a flexible circuit board 282. The key part 281 is a touch main unit keyboard, and in another embodiment, the key part 281 may also be a mechanical main unit keyboard. The flexible circuit board 282 extends from a position of the key part 281 close to an edge of the key part 281, and the flexible circuit board 282 extends from a surface of the key part 281 close to an inside of the main body 21. A second connector 283 is provided at an end of the flexible circuit board 282 facing away from the key part 281.

As shown in FIGS. 2 to 5, in one embodiment, the front shell 204 of the main body 21 has a groove 280 on a side where the front end surface 201 is located, and the groove 280 fits to the main unit keyboard 28. A through hole 280a is defined in a bottom of the groove 280, and a position, shape and size of the through hole 280a correspond to those of the flexible circuit board 282. The key part 281 is received in the groove 280, and the edge of the key part 281 is adhered to the edge of the bottom of the groove 280 by an adhesive, such that a surface of the key part 281 close to the inside of the main body 21 is fixedly connected to the bottom of the groove 280. The flexible circuit board 282 passes through the through hole 280a and extends into the inside of the main body 21

Figure 4:
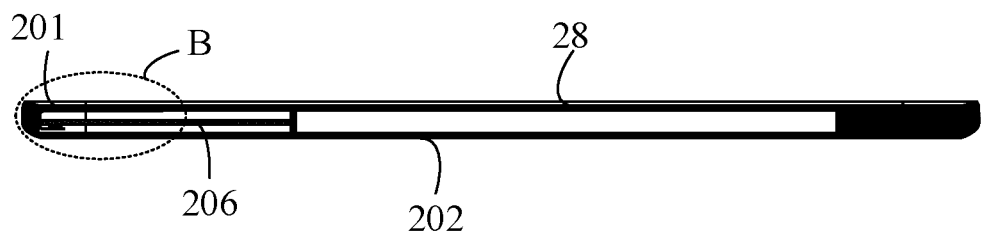
FIG. 4 is a schematic sectional view of the main unit as shown in FIG. 2.
Figure 5:
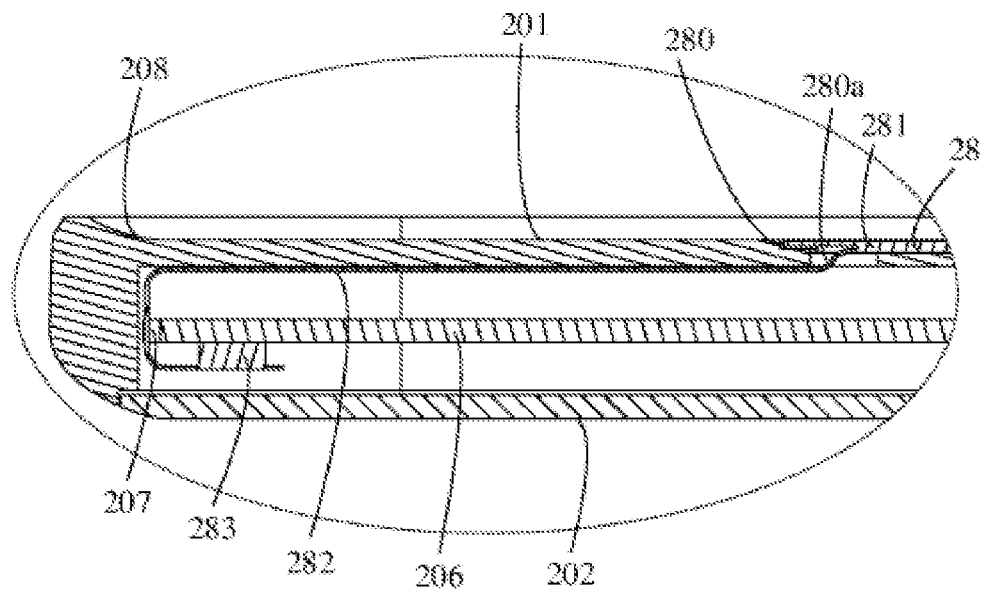
FIG. 5 is a schematic enlarged view of part B of a structure as shown in FIG. 4.

As shown in FIGS. 3 to 5, in one embodiment, the main board 206 is located between the front shell 204 and the rear shell 205, and a first connector fitting to the second connector 283 is disposed on a side of the main board 206 facing away from the front shell 204. One of the first connector and the second connector 283 is a male connector, and the other is a female connector. An avoidance recess 207 is defined in an end of the main board 206. The flexible circuit board 282 passes through the avoidance recess 207, in such a manner that the second connector 283 can be wound to a side of the main board 206 close to the rear shell 205. In other words, one end of the flexible circuit board 282 provided with the second connector 283 is bent into a U-shape, such that the second connector 283 can be fastened to the first connector, thereby achieving data or current transmission between the key part 281 and the main board 206. A part of the flexible circuit board 282 between the front shell 204 and the main board 206 is adhered to an inner surface of the front shell 204.

With the above arrangement, when assembling the main unit 20, firstly, the flexible circuit board 282 is configured to pass through the through hole 280a, the key part 281 is placed in the groove 280, and then the key part 281 is adhered and fixed to the bottom of the groove 280 by an adhesive. Then, the flexible circuit board 282 is adhered to the inner surface of the front shell 204, without fixing an end thereof provided with the second connector 283. After that, the main board 206 is loaded into an internal cavity of the main body 21 from a back of the main body 20, in such a manner that the second connector 283 passes through the avoidance recess 207. Then, the main board 206 is fixed, and the first connector is fastened to the second connector 283. The back of the main unit 20 is covered with the rear shell 205, and the rear shell 205 is fixed to a middle frame or the front shell 204 of the main body 20. The above arrangement enables the main unit keyboard 28 to be mounted to the main unit 20 more easily, which leads to simple operations and that improves a mounting efficiency.

Figure 6:
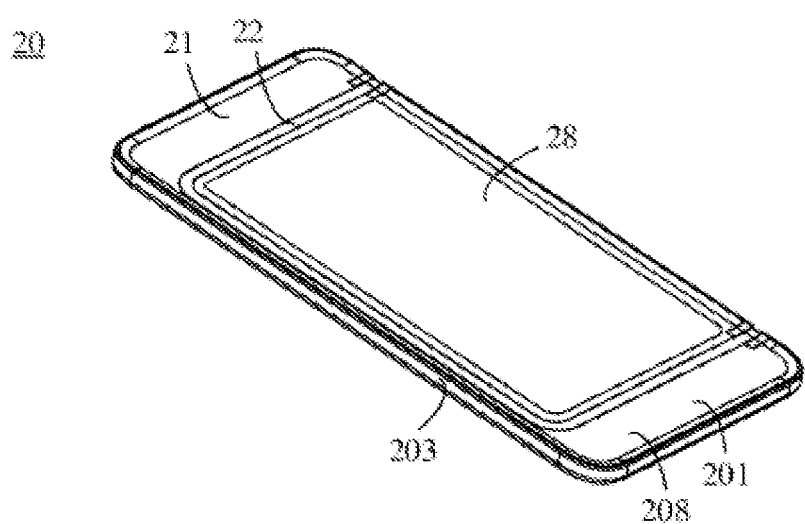
FIG. 6 is a schematic three-dimensional diagram of a main unit of the mobile phone as shown in FIG. 1 according to another embodiment, in which a support is located at a first position.
Figure 7:
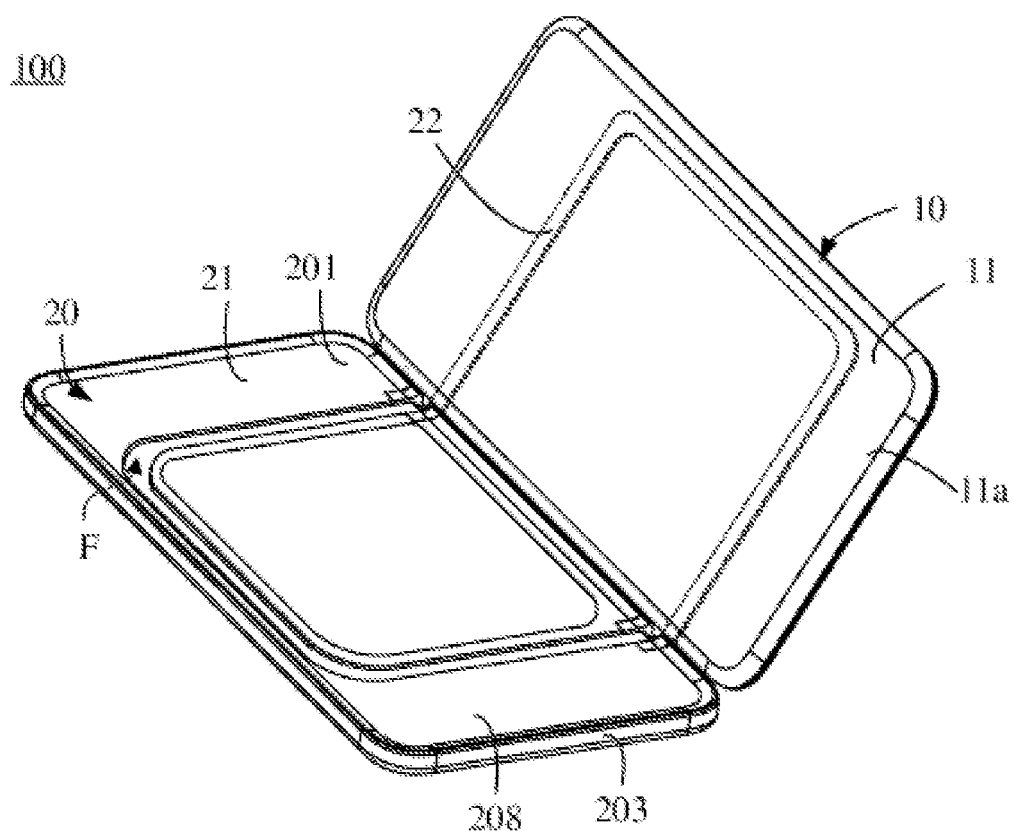
FIG. 7 is a schematic three-dimensional diagram of the mobile phone as shown in FIG. 1 according to yet another embodiment, in which a support is located at a second position and a sub unit leans obliquely against the support.

As shown in FIGS. 6 and 7, in one embodiment, the main unit 20 includes a support 22 movably connected to the main body 21. The main body 21 has a receiving groove F, and the support 22 is provided in the receiving groove F and is rotatable with respect to the main body 21 to be located at a first position or a second position. As shown in FIG. 6, when the support 22 is at the first position, the support 22 is received in the receiving groove F, such that the support 22 can be moved to the first position when not in use, and can be received in the receiving groove F, and thus the sub unit 10 and the main body 21 can be stacked for the convenience of use or carry. In addition, since the support 22 can be received in the receiving groove F without becoming protuberant, the overall aesthetics of the outer appearance of the main unit 20 can be improved. As shown in FIG. 7, when the support 22 is located at the second position, the support 22 is rotated out of the receiving groove F to have a right or obtuse angle with respect to the main body 21, such that the sub unit 10 can lean obliquely against the support 22. The sub unit 10 can be arranged obliquely with respect to the main body 21 by leaning against the support 22, so as to facilitate viewing contents on the displayable area of the sub unit 10.

As shown in FIGS. 6 and 7, in one embodiment, the receiving groove F penetrates through the front end surface 201 and the side end surface 203. When the support 22 needs to be rotated out of the receiving groove F to the second position, since the receiving groove F penetrates through the side end surface 203, the main body 21 will not block the support 22 at the side end surface 203, so that the support 22 can be conveniently rotated out of the receiving groove F without providing any fastening points.

In one embodiment, the support 22 is of a U-shape, which has an opening facing towards the right end of the main body 21, and the support 22 can rotate with a line connecting both ends of the opening as an axis, so as to rotate to the first position or the second position. The receiving groove F matches the support 22, and the receiving groove F may be U-shaped, C-shaped or rectangle depending on different shapes of the support 22, which is not specifically limited herein. When the support 22 is located at the first position, the receiving groove F is filled with the support 22, in such a manner that a surface of the support 22 facing away from the rear end surface 202 is flush with the front end surface 201. This can not only improve the overall aesthetics of the main unit 20, but also at the same time, the support 22 will not interfere with the sub unit 10 when the subordinate 10 and the main body 21 are stacked.

In one embodiment, the main unit 20 includes a Hall element capable of being in communicative connection with the main board 206. A magnet is disposed on a side of the support 22 close to the main body 21. When the support 22 is located at the first position, the Hall element can sense the magnet and send a signal to the main board 206. The main board 206 can control the main unit keyboard 28 to be turned off after receiving the signal, i.e., the main unit keyboard 28 is in a non-operation state. When the support 22 is located at the second position by rotating from the first position, the Hall element cannot sense the magnet and send a signal to the main board 206. After receiving the signal, the main board 206 can activate the main unit keyboard 28, such that the main unit keyboard 28 is in an operation state. In this case, the user can control the mobile phone 100 by operating the main unit keyboard 28, and further control the display of the display screen 11.

As shown in FIGS. 5 to 7, in one embodiment, the front shell 204 has a mounting groove 208 on a side where the front end surface 201 is located, and the rear surface of the sub unit 10 has a curved structure fitting to the mounting groove 208. When the sub unit 10 is mounted to the main unit 20, a part of the structure of the sub unit 10 is received in the mounting groove 208, and the rear surface is surrounded by an edge of the front end surface 201, and the side end surface 203 is flush with the peripheral side surface 101. A gap is formed between the rear surface of the sub unit 10 and the main unit keyboard 28, which prevents the sub unit 10 from pressing the main unit keyboard 28, thereby better protecting the main unit keyboard 28. With the above structure, the mounting groove 208 can better receive the sub unit 10, thereby facilitating positioning the sub unit 10 on the main unit 20 while achieving a better protection effect on the main unit 20.

In one embodiment, contacts are disposed at corresponding positions of the rear surface and the front end surface 201. When the sub unit 10 is assembled with the main unit 20 through the attachment of the rear surface with the front end surface 201, the contacts on the rear surface cooperate with the contacts on the front end surface 201, in such a manner that current or data transmission between the main unit 20 and the sub unit 10 can be achieved.

Figure 8:
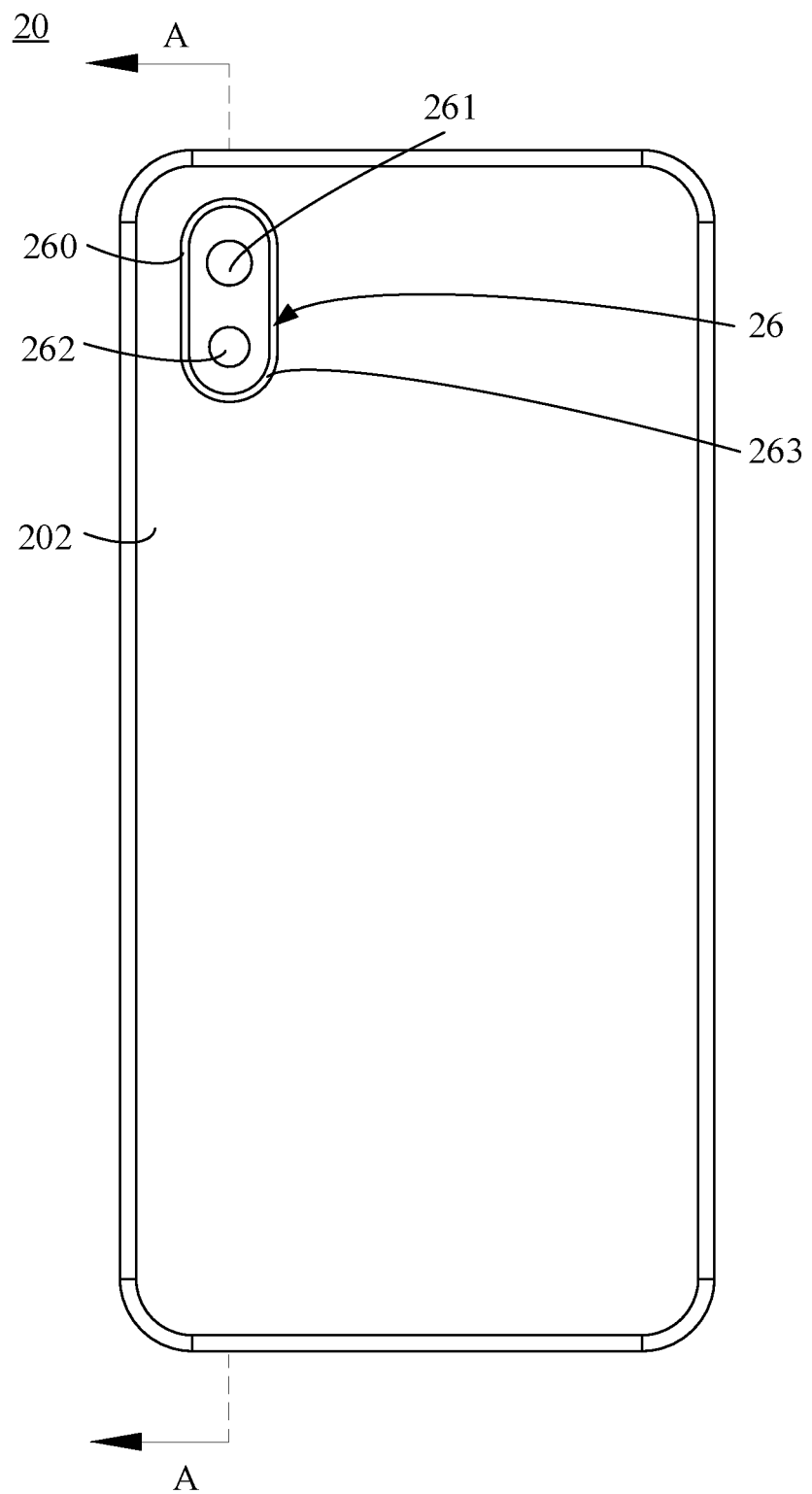
FIG. 8 is a rear view of the main unit as shown in FIG. 6.

As shown in FIG. 8, in one embodiment, the main body 21 includes a camera assembly 26. The rear end surface 202 of the main body 21 has a through hole 260 provided therein, and the camera assembly 26 passes through the through hole 260 and is fixed to the rear end surface 202.

Figure 9:
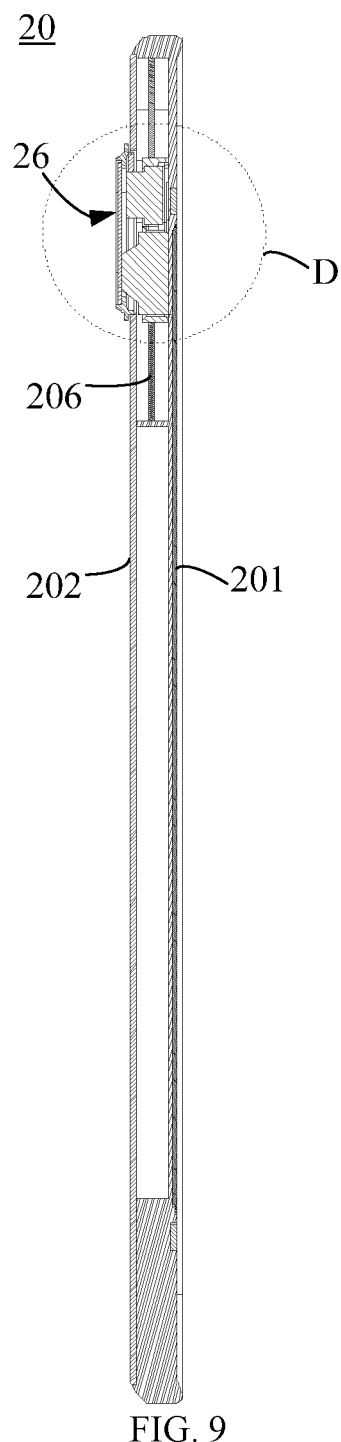
FIG. 9 is a schematic cross-sectional view taken along A-A of the main unit as shown in FIG. 8.
Figure 10:
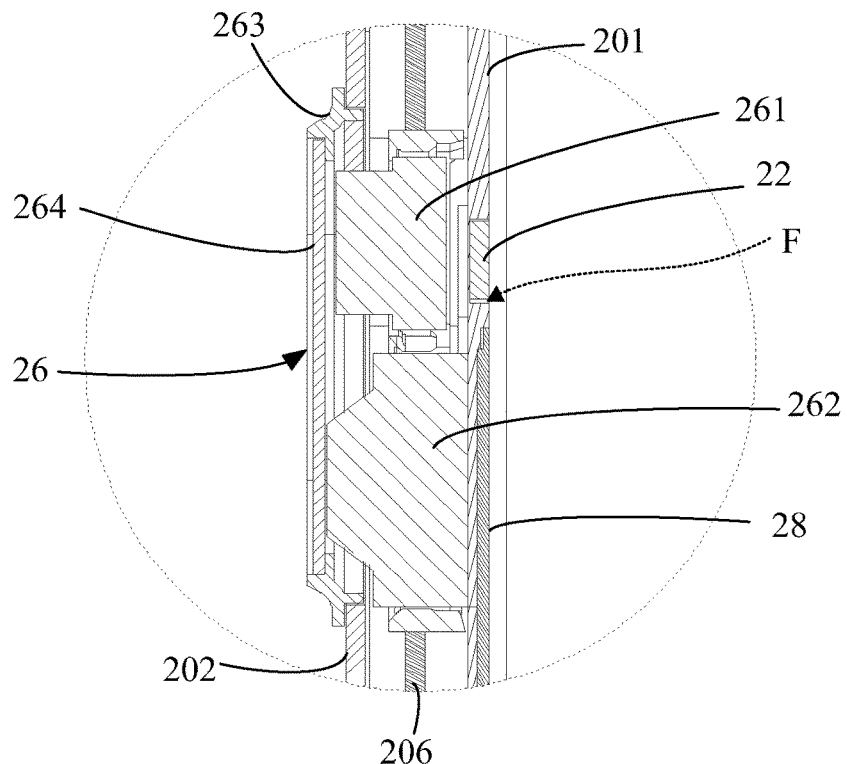
FIG. 10 is a schematic enlarged view of part D of a structure as shown in FIG. 9.

As shown in FIGS. 9 and 10, in one embodiment, the camera assembly 26 includes a first camera 261, a second camera 262, a decoration frame 263, and a lens 264. The first camera 261 and the second camera 262 are disposed side by side in the length direction of the main unit 20 inside the main unit 20. The first camera 261 and the second camera 262 pass through the main board 206. A light incident surface of the first camera 261 and a light incident surface of the second camera 262 are exposed to the rear end surface 202. The first camera 261 and the second camera 262 are substantially flush with each other on a side thereof close to the rear end surface 202. The decoration frame 263 passes through the through hole 260 and is fixed within the through hole 260. A part of a structure of the decoration frame 263 protrudes from the rear end surface 202. The lens 264 is fixed on the decorative frame 263 and covers the first camera 261 and the second camera 262. The light incident surface of the first camera 261 and the light incident surface of the second camera 262 are both located at the lens 264.

As shown in FIGS. 9 and 10, in one embodiment, the first camera 261 is a secondary camera, and the second camera 262 is a primary camera. A distance between the front end surface 201 and the rear end surface 202 is defined as a thickness of the main unit 20. In the thickness direction of the main unit 20, a thickness of the first camera 261 is smaller than a thickness of the second camera 262. Then, the second camera 262 protrudes with respect to the first camera 261, in such a manner that a recessed region is formed. A wall of the receiving groove F penetrates through the recessed region. As shown in FIG. 9, in the thickness direction of the main unit 20, the receiving groove F is recessed towards the direction of the first camera 261, thereby utilizing fully the space in the thickness direction of the main unit 20. When the support 22 is located at the first position, the support 22 is received in the receiving groove F, and the support 22 and the first camera 261 are stacked in the thickness direction of the main unit 20, such that the space in the main unit 20 can be effectively utilized, thereby avoiding an increase in the thickness of the main unit 20 and thus facilitating lightening and thinning of the main unit 20.

In one embodiment, the support 22 has a U-shaped structure, and the receiving groove F is U-shaped. The receiving groove F includes two mutually parallel grooves. One of the two grooves is in a thickness direction of the first camera 261, and the other one may be arranged in accordance with an arrangement of components inside the main unit 20 and may be provided, as far as possible, at a part of the main unit 20, in the thickness direction thereof, which is not completely occupied by components, thereby effectively utilizing the internal space of the main unit 20 and avoiding an increase in the thickness of the main unit 20.

In another embodiment, the camera assembly 26 may be laterally disposed. It can be appreciated that, in this case, the first camera 261 and the second camera 262 are arranged side by side in the width direction of the main unit 20. The receiving groove F may be provided at an upper side or a lower side of the camera assembly 26, in such a manner that the positions of the main unit 20 and the camera assembly 26 are staggered in the thickness direction of the main unit 20. In addition, components inside the main unit 20 are effectively arranged so as to reserve space for the receiving groove F. Further, when the support 22 is located at the first position, the thickness of the main unit 20 may be not increased.

In one embodiment, the main body 21 includes a magnetic member, and the sub unit 10 includes a magnetic mating member. When the sub unit 10 is stacked on the front end surface 201 from a side where the rear surface is located or a side where the front surface 11a is located, the magnetic member can attract the magnetic mating member, so as to connect the sub unit 10 to the main body 21. It can be appreciated that, when the sub unit 10 needs to be stacked to the main body 21, the support 22 can be rotated to the first position. In this case, since the support 22 can be received within the receiving groove F when being at the first position, the sub unit 10 may not be interfered by the support 22, and thus can be stacked more closely to the main body 21. Meanwhile, the magnetic member can be easily aligned with the magnetic mating member to ensure the magnetic mating effect therebetween.

In one embodiment, the main body 21 is provided with N magnetic members, and the sub unit 10 is provided with N magnetic mating members, where N is an integer greater than or equal to 2. When the sub unit 10 is stacked to the main body 21, the magnetic members and the magnetic mating members are in one-to-one correspondence and can magnetically cooperate with each other, so as to achieve a large magnetic attraction and improve the magnetic mating stability between the sub unit 10 and the main body 21.

In one embodiment, one of the magnetic member and the magnetic mating member includes a magnet, and the other includes a magnetic metal member. It can be appreciated that the magnetic metal member is a member made of a metal material capable of being magnetically attracted, such as a magnet block or a magnetic steel or the like.

In other embodiments, the magnetic member and the magnetic mating member are both magnets. Whether the side of the sub unit 10 facing away from the front surface 11a or the side of the sub unit 10 where the front surface 11a is located, is placed on the front end surface 201 of the main body, the magnetic fixation between the sub unit 10 and the main body 21 can be achieved by the magnetic attraction between magnets. Consequently, when a part of the magnets on the sub unit 10 is flipped together with the sub unit 10 in such a manner that a different surface thereof faces towards the main body 21, a magnetic pole orientation of the magnets on the sub unit 10 may change, but the main body 21 can always have corresponding magnets to cooperate with the magnets on the sub unit 10 via magnetic attraction.

In other embodiments, a metal material capable of achieving magnetic attraction may also be selected as a material for a housing of the sub unit 10 to form a metal housing. In this way, the magnetic attracting force of the magnetic member to the metal housing can be utilized to enable the sub unit 10 to be attracted and attached to the main body 21, such that the sub unit 10 can be stably stacked on the front end surface 201 of the main body 21. That is to say, when the sub unit 10 is stacked on the front end surface 201, the magnetic member 23 can attract the metal housing, so that the sub unit 10 can be detachably connected to the main body 21.

In the embodiment in which the sub unit 10 includes a metal housing, since the metal housing of the sub unit 10 itself can be attracted by a magnetic force, there is no need to provide the magnetic mating member additionally, thereby reducing the reserved space for arranging the magnetic mating member. In this way, the sub unit 10 can be made thinner and lighter, and thus is portable.

Figure 11:
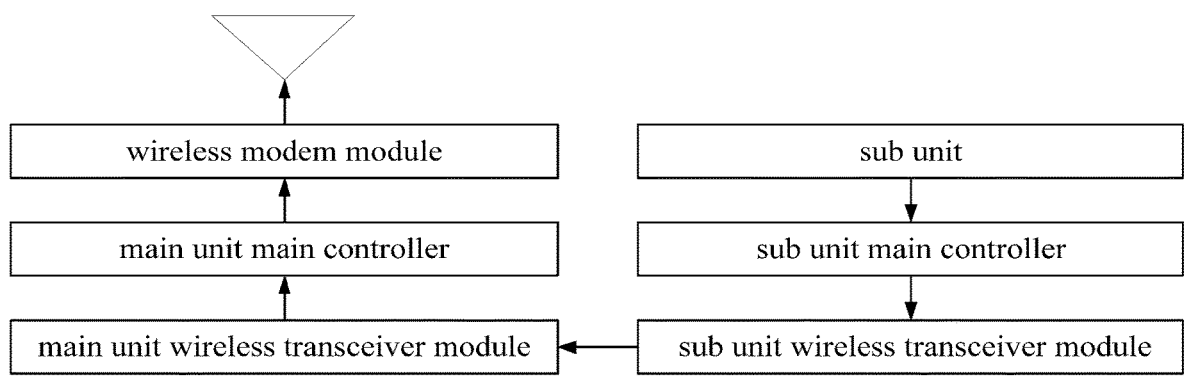
FIG. 11 is a flowchart of a mobile phone in a first operation state according to an embodiment.
Figure 12:
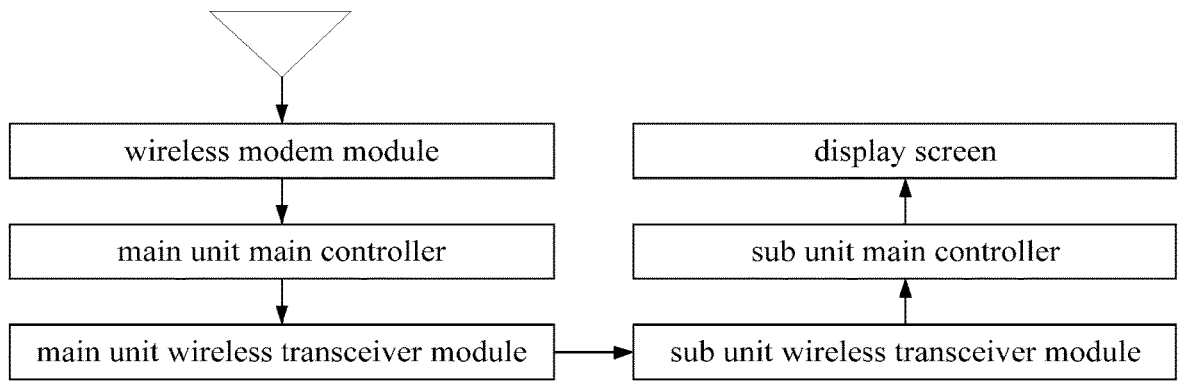
FIG. 12 is another flowchart of the mobile phone as shown in FIG. 11 in the first operation state.

As shown in FIGS. 11 and 12, in one embodiment, the sub unit 10 includes a sub unit keyboard, a sub unit main controller, a sub unit wireless transceiver module and a display screen 11. The main unit includes a wireless modem module, a main unit main controller, and a main unit wireless transceiver module capable of communicating with the sub unit wireless transceiver module. In a first operation state of the mobile phone 100, under control of the sub unit main controller, a control signal outputted by the sub unit keyboard is modulated by the sub unit wireless transceiver module and then transmitted to the main unit wireless transceiver module. Then, under control of the main unit main controller, the control signal is modulated by the wireless modem module and transmitted to the air, thereby completing transmission of the control signal. A control signal from the air is demodulated by the wireless modem module and transmitted to the main unit main controller. Under control of the main unit main controller, the control signal is modulated by the main unit wireless transceiver module and transmitted to the sub unit 10. The control signal is received by the sub unit wireless transceiver module, and is displayed on the display screen 11 under control of the sub unit main controller. At this time, the receiving of the control signal is completed.

Figure 13:
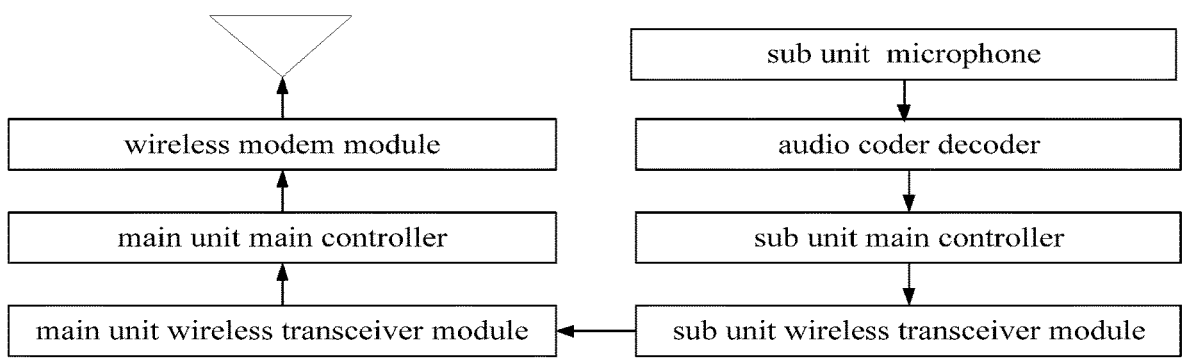
FIG. 13 is a flowchart of a mobile phone in a second operation state according to an embodiment.
Figure 14:
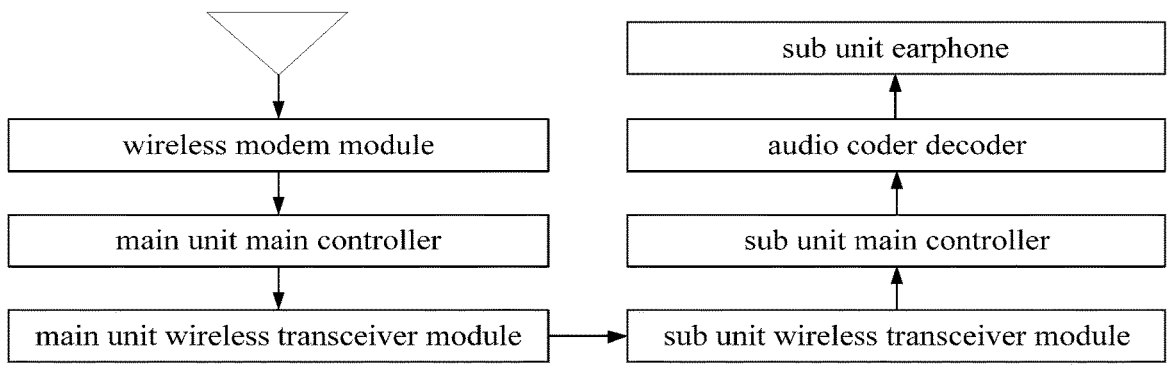
FIG. 14 is another flowchart of the mobile phone shown in FIG. 13 in the second operation state.

As shown in FIGS. 13 and 14, in one embodiment, the sub unit 10 may include a sub unit main controller, a microphone, an earphone, a sub unit wireless transceiver module, an audio encoder, and an audio decoder. The audio encoder enables an audio signal to be encoded during transmission, thereby facilitating transmission, storage or encryption of the audio signal. The audio decoder can decode the encoded audio signal. The main unit may include a wireless modem module, a main unit main controller, and a main unit wireless transceiver module capable of communicating with the sub unit wireless transceiver module. In a second operation state of the mobile phone 100, an audio signal from the microphone is encoded by the audio encoder and then transmitted to the sub unit main controller. Under control of the sub unit main controller, the encoded audio signal is transmitted by the sub unit wireless transceiver module to the main unit wireless transceiver module. Under control of the main unit main controller, the encoded audio signal is transmitted to the wireless modem module. After being modulated by the wireless modem module, the audio signal is transmitted to the air, thereby completing the encoding and transmission of the audio signal. An encoded audio signal from the air is demodulated by the wireless modem module and then transmitted to the main unit main controller. Under control of the main unit main controller, the encoded audio signal is transmitted to the main unit wireless transceiver module, modulated by the main unit wireless transceiver module, and then is transmitted to the sub unit 10. Then, the encoded audio signal from the air is demodulated by the sub unit wireless transceiver module. Under control of the sub unit main controller, the encoded audio signal from the air is decoded by the audio decoder and outputted by the earphone. At this time, the receiving and decoding of the audio signal are completed. It can be appreciated that the audio encoder may be a separate hardware unit, or may be integrated in the microphone, or may be integrated in a sub unit main controller, and may be an audio codec having an audio decoding function. The audio decoder may be a separate hardware unit, or may be integrated in the earphone, or may be integrated in a sub unit main controller, and may be an audio codec having an audio encoding function.

Figure 15:
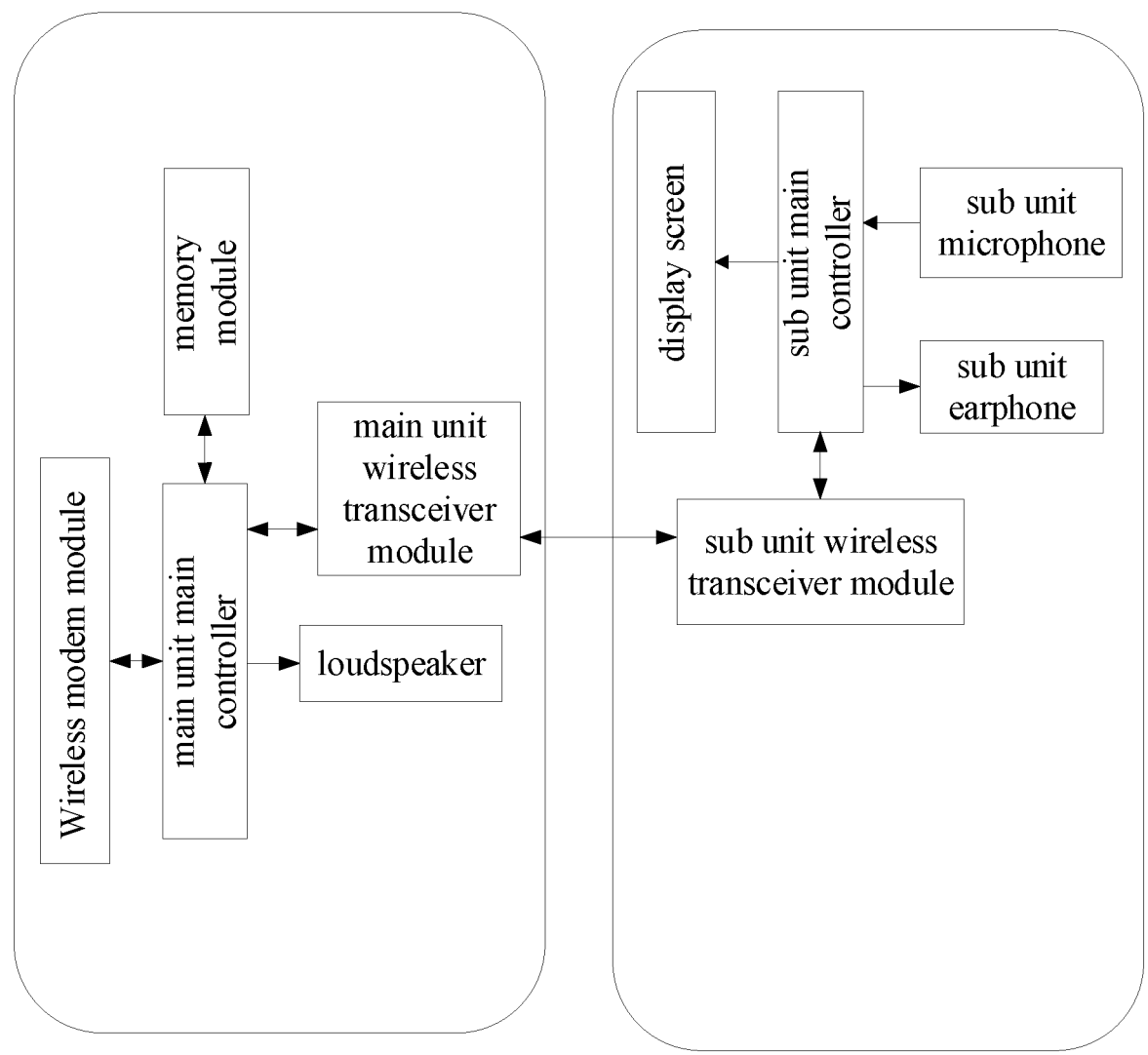
FIG. 15 is a modular structure diagram of a mobile phone according to an embodiment.
Figure 16:
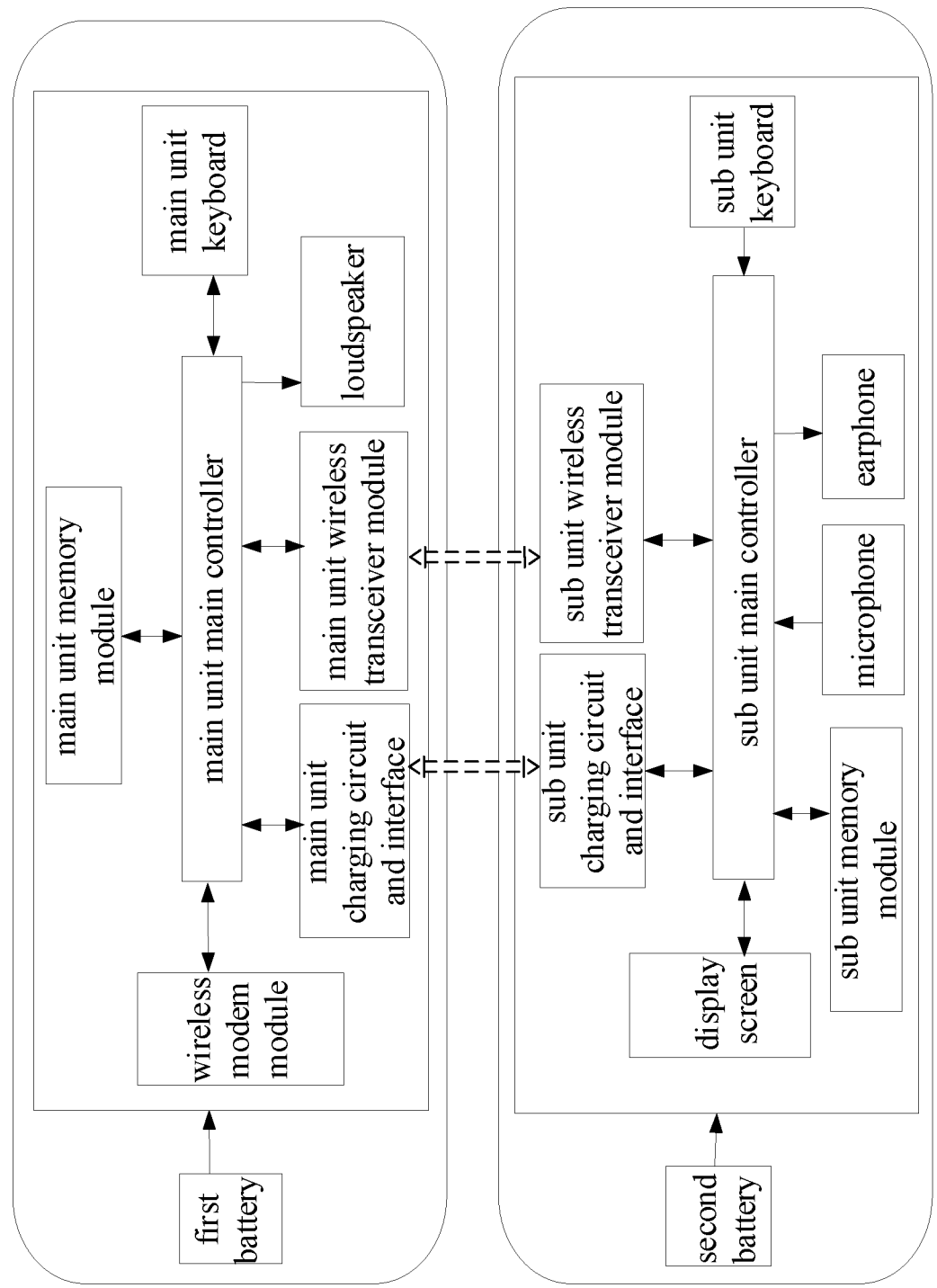
FIG. 16 is a modular structure diagram of a mobile phone according to another embodiment.

As shown in FIGS. 15 and 16, in an embodiment, the sub unit 10 may include a sub unit main controller and a sub unit wireless transceiver module. The sub unit main controller is capable of communicating with the sub unit wireless transceiver module. The main unit 20 may include a wireless modem module, a main unit main controller, and a main unit wireless transceiver module capable of communicating with the sub unit wireless transceiver module. The main unit main controller is capable of communicating with the wireless modem module and the main unit wireless transceiver module. The sub unit 10 is capable of accessing a communication network through the main unit 20.

Figure 17:
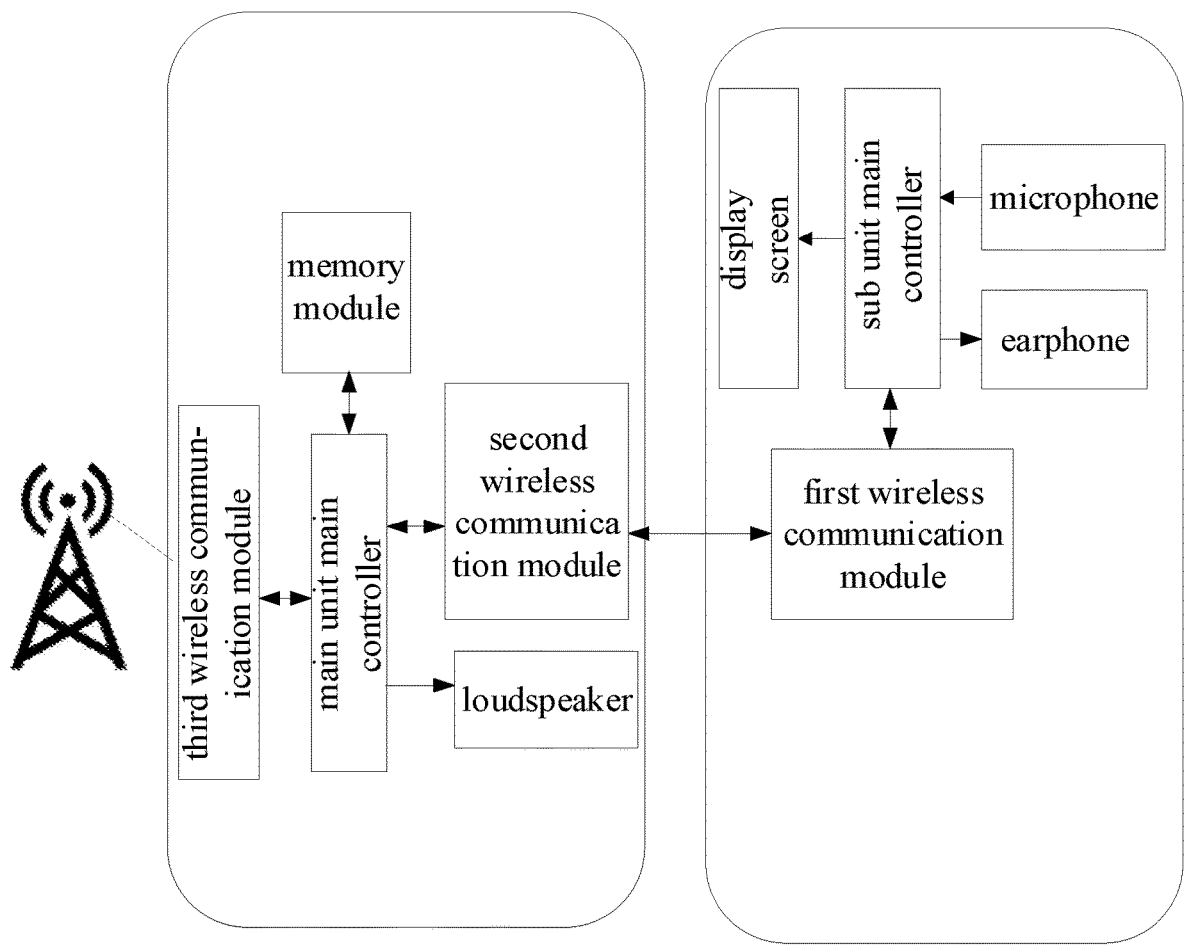
FIG. 17 is a modular structure diagram of a mobile phone according to yet another embodiment.

As shown in FIG. 17, in an embodiment, the sub unit 10 may include a sub unit main controller and a first wireless communication module. The sub unit main controller is capable of communicating with the first wireless communication module. The main unit 20 may include a main unit main controller, a second wireless communication module and a third wireless communication module. The main unit main controller is capable of communicating with the second wireless communication module and the third wireless communication module, the second wireless communication module is capable of communicating with the first wireless communication module, and the third wireless communication module is capable of communicating with a base station. In an embodiment, the second wireless communication module and the first wireless communication module are both low-power Bluetooth communication modules. In other embodiments, both the second wireless communication module and the first wireless communication module may be wireless local area network (WiFi, Wireless Fidelity) communication modules.

Respective technical features of the embodiments described above can be combined arbitrarily, and for brevity of the description, not all the possible combinations of the respective technical features in the embodiments described above have been described. However, the combinations of these technical features should be considered to fall within the scope of disclosure provided that they do not conflict.

The above embodiments merely present several embodiments of the present disclosure, and the description thereof is more specific and detailed, but cannot be construed as limiting the scope of the present disclosure. It should be noted that, for a person of ordinary skill in the art, several modifications and improvements can also be made without departing from the concept of the present disclosure, and are all encompassed by the protection scope of the present disclosure. Therefore, the protection scope of the present disclosure should be defined by the appended claims.

What is claimed is:

1. An electronic terminal, comprising:
a main body having a groove, wherein a through hole is defined in a bottom of the groove, a main board is provided in the main body, and a first connector is provided on a side of the main board facing away from the groove; and
a keyboard mounted in the groove and comprising a key part and a flexible circuit board that are connected to each other, wherein an end of the flexible circuit board facing away from the key part is provided with a second connector configured to match the first connector, the key part is received in the groove, the flexible circuit board passes through the through hole and extends into an inside of the main body, and the second connector is fastened to the first connector,
wherein the main body comprises a front shell and a rear shell that are opposite to each other, and the groove is located in the front shell, and
the electronic terminal further comprises a support, wherein:
a receiving groove is defined in the front shell and matches the support, and the support is rotatable with respect to the electronic terminal to be located at a first position or a second position;
at the first position, the support is located within the receiving groove; and
at the second position, at least a part of the support is located outside the receiving groove, and the keyboard is activated.

2. The electronic terminal according to claim 1, wherein an avoidance recess is defined in an end of the main board, and the flexible circuit board passes through the avoidance recess such that the second connector is wound to a side of the main board facing away from the groove.

3. The electronic terminal according to claim 1, wherein at least a part of the flexible circuit board is adhered to an inner surface of the front shell, and the keyboard is adhered to the bottom of the groove by an adhesive.

4. The electronic terminal according to claim 1, wherein the receiving groove is a U-shaped groove, and the groove is surrounded by the support at the first position.

5. The electronic terminal according to claim 1, further comprising a camera assembly, wherein the camera assembly comprises a first camera and a second camera, a thickness of the first camera is smaller than a thickness of the second camera, and when the support is located at the first position, at least a part of the support and the first camera are stacked.

6. The electronic terminal according to claim 1, further comprising a Hall element, wherein the Hall element is communicatively connected to the main board, and a magnet is provided on the support;
when the support is located at the first position, the Hall element senses the magnet and the main board controls the keyboard to be turned off; and
when the support is rotated from the first position to the second position, the Hall element fails to sense the magnet and the main board activates the keyboard.

7. A mobile phone, comprising:
a first unit comprising a main body and a first keyboard, wherein the main body has a groove, a through hole is defined in a bottom of the groove, a main board is provided in the main body, and a first connector is provided on a side of the main board that faces away from the groove; and the first keyboard is mounted in the groove and comprises a key part and a flexible circuit board that are connected to each other, an end of the flexible circuit board facing away from the key part is provided with a second connector configured to match the first connector, the key part is received in the groove, the flexible circuit passes through the through hole and extends into an inside of the main body, and the second connector is fastened to the first connector; and
a second unit detachably mountable to the main body,
wherein the first unit comprises a front shell and a rear shell that are opposite to each other, and the groove is located in the front shell;
the first unit further comprises a support, a receiving groove is defined in the front shell and matches the support, and the support is rotatable with respect to the first unit to be located at a first position or a second position;
at the first position, the support is located within the receiving groove; and
at the second position, at least a part of the support is located outside the receiving groove such that the second unit leans obliquely against the support, and the first keyboard is activated.

8. The mobile phone according to claim 7, wherein a mounting groove is defined in the front shell, the groove penetrates through a bottom of the mounting groove, the receiving groove penetrates through a bottom of the receiving groove, and when the second unit is mounted to the main body, a part of the second unit is received in the mounting groove, and a gap is formed between the second unit and the first keyboard.

9. The mobile phone according to claim 7, wherein the first unit and the second unit are both provided with contacts, and in a state that the second unit is mounted to the main body, the contacts of the first unit and the contacts of the second unit are in contact to transmit currents or data between the first unit and the second unit.

10. The mobile phone according to claim 7, wherein the main body further comprises a magnetic member, and the second unit comprises a magnetic mating member, when the second unit is mounted to the main body, the magnetic member attracts the magnetic mating member to connect the second unit to the main body.

11. The mobile phone according to claim 7, wherein the second unit comprises a second keyboard, a second main controller, a second wireless transceiver module, and a display screen; and the first unit further comprises a wireless modem module, a first main controller, and a first wireless transceiver module capable of communicating with the second wireless transceiver module, in a first operation state of the mobile phone, under control of the second main controller, a control signal outputted by the second keyboard is modulated by the second wireless transceiver module and then transmitted to the first wireless transceiver module, and under control of the first main controller, the control signal is modulated by the wireless modem module and transmitted to the air; and a control signal from the air is demodulated by the wireless modem module and then transmitted to the first main controller, and under control of the first main controller, the control signal is modulated by the first wireless transceiver module and then transmitted to the second unit, and the control signal is received by the second wireless transceiver module and then displayed on the display screen under control of the second main controller.

12. The mobile phone according to claim 7, wherein the second unit comprises a second main controller, a microphone, an earphone, a second wireless transceiver module, an audio encoder, and an audio decoder; and the first unit comprises a wireless modem module, a first main controller, and a first wireless transceiver module capable of communicating with the second wireless transceiver module, in a second operation state of the mobile phone, an audio signal from the microphone is encoded by the audio encoder and then transmitted to the second main controller, the encoded audio signal is transmitted by the second wireless transceiver module to the first wireless transceiver module under control of the second main controller, then under control of the first main controller, the encoded audio signal is transmitted to the wireless modem module, modulated by the wireless modem module, and then transmitted to the air; and an encoded audio signal from the air is demodulated by the wireless modem module and then transmitted to the first main controller, and under control of the first main controller, the encoded audio signal is transmitted to the first wireless transceiver module, modulated by the first wireless transceiver module and then transmitted to the second unit, then the encoded audio signal is demodulated by the second wireless transceiver module, and under control of the second main controller, the encoded audio signal is decoded by the audio decoder and outputted by the earphone.

13. The mobile phone according to claim 7, wherein the second unit comprises a second main controller and a second wireless transceiver module, the second main controller being capable of communicating with the second wireless transceiver module; and the first unit comprises a wireless modem module, a first main controller, and a first wireless transceiver module capable of communicating with the second wireless transceiver module, the first main controller being capable of communicating with the wireless modem module and the first wireless transceiver module, and the second unit being capable of accessing a communication network through the first unit.

14. The mobile phone according to claim 7, wherein the second unit comprises a second main controller and a first wireless communication module, the second main controller being capable of communicating with the first wireless communication module; and the first unit comprises a first main controller, a second wireless communication module, and a third wireless communication module, the first main controller being capable of communicating with the second wireless communication module and the third wireless communication module, the second wireless communication module being capable of communicating with the first wireless communication module, and the third wireless communication module being capable of communicating with a base station.

* * * * *